United States Patent
Twitchen et al.

(10) Patent No.: US 8,669,764 B2
(45) Date of Patent: Mar. 11, 2014

(54) MICROFLUIDIC CELL AND A SPIN RESONANCE DEVICE FOR USE THEREWITH

(75) Inventors: Daniel James Twitchen, London (GB); Matthew Lee Markham, Maidenhead (GB)

(73) Assignee: Element Six Limited, Ballasalla (IM)

(*) Notice: Subject to any disclaimer, the term of this patent is extended or adjusted under 35 U.S.C. 154(b) by 0 days.

(21) Appl. No.: 13/821,952

(22) PCT Filed: Sep. 8, 2011

(86) PCT No.: PCT/EP2011/065573
§ 371 (c)(1),
(2), (4) Date: Jun. 10, 2013

(87) PCT Pub. No.: WO2012/034924
PCT Pub. Date: Mar. 22, 2012

(65) Prior Publication Data
US 2014/0035584 A1 Feb. 6, 2014

Related U.S. Application Data

(60) Provisional application No. 61/382,562, filed on Sep. 14, 2010.

(30) Foreign Application Priority Data

Sep. 14, 2010 (GB) .................. 1015260.1

(51) Int. Cl.
*G01V 3/00* (2006.01)
(52) U.S. Cl.
USPC ........................................ 324/321

(58) Field of Classification Search
USPC .................................. 324/300–322
See application file for complete search history.

(56) References Cited

U.S. PATENT DOCUMENTS

| | | | |
|---|---|---|---|
| 6,194,900 B1 | 2/2001 | Freeman et al. | |
| 6,592,519 B1 * | 7/2003 | Martinez | 600/309 |
| 7,279,112 B2 * | 10/2007 | Martinez | 216/37 |
| 8,193,808 B2 * | 6/2012 | Fu et al. | 324/304 |
| 8,586,913 B2 * | 11/2013 | Zhou et al. | 250/255 |
| 2009/0214169 A1 | 8/2009 | Linares et al. | |
| 2010/0271016 A1 | 10/2010 | Barclay et al. | |
| 2011/0062957 A1 * | 3/2011 | Fu et al. | 324/307 |
| 2012/0051996 A1 * | 3/2012 | Scarsbrook et al. | 423/446 |
| 2013/0270991 A1 * | 10/2013 | Twitchen et al. | 313/110 |

FOREIGN PATENT DOCUMENTS

| | | |
|---|---|---|
| EP | 1 290 251 B1 | 11/2005 |
| EP | 1 292 726 B1 | 9/2008 |
| WO | 2009046350 A1 | 4/2009 |
| WO | 2009073736 A1 | 6/2009 |

(Continued)

OTHER PUBLICATIONS

Search Report for GB1115515.7 dated Nov. 21 2011.

(Continued)

*Primary Examiner* — Dixomara Vargas
(74) *Attorney, Agent, or Firm* — Bryan Cave LLP

(57) ABSTRACT

A microfluidic cell comprising: a microfluidic channel (32) for receiving a fluid sample; and a sensor (30) located adjacent the microfluidic channel; wherein the sensor comprises a diamond material comprising one or more quantum spin defects (34). In use, a fluid sample is loaded into the microfluidic cell and the fluid is analyzed via magnetic resonance using the quantum spin defects.

17 Claims, 8 Drawing Sheets

(56) References Cited

FOREIGN PATENT DOCUMENTS

| WO | 2009073740 A2 | 6/2009 |
|---|---|---|
| WO | 2009105814 A1 | 9/2009 |
| WO | 2009105815 A1 | 9/2009 |
| WO | 2009138760 A1 | 11/2009 |
| WO | 2010003179 A1 | 1/2010 |
| WO | 2010010344 A1 | 1/2010 |
| WO | 2010010352 A1 | 1/2010 |
| WO | 2010051580 A1 | 5/2010 |

OTHER PUBLICATIONS

Search Report for GB1015260.1 dated Dec. 15, 2010.

Maze et al., "Nanoscale magnetic sensing with an individual electronic spin in diamond," Nature, vol. 455, 2008, pp. 644-647.
Erickson, D., et al. "Integrated Microfluidic Devices", Analytica Chimica Acta 507, 11-26, 2004.
Degen, C.L., "Scanning Magnetic Field Microscope with a Diamond Single-Spin Sensor,", Applied Physics Letters 92, 243111, 2008.
Steinert, et al., "High Sensitivity Magnetic Imaging Using an Array of Spins in Diamond,", Review of Scientific Instruments, 81, 043705, 2010.
International Search Report for PCT/EP2011/065573 dated Feb. 20, 2012.
Barclay, P., "Diamond Based Nanophotonics: Towards Computing and Sensing with Single Spins," Internet Article dated May 4, 2010 pp. 1-46, http://optoelectronics.ece.ucsb.edu/sites/default/files/shared/docs/Barclay-slides.PDF.

* cited by examiner

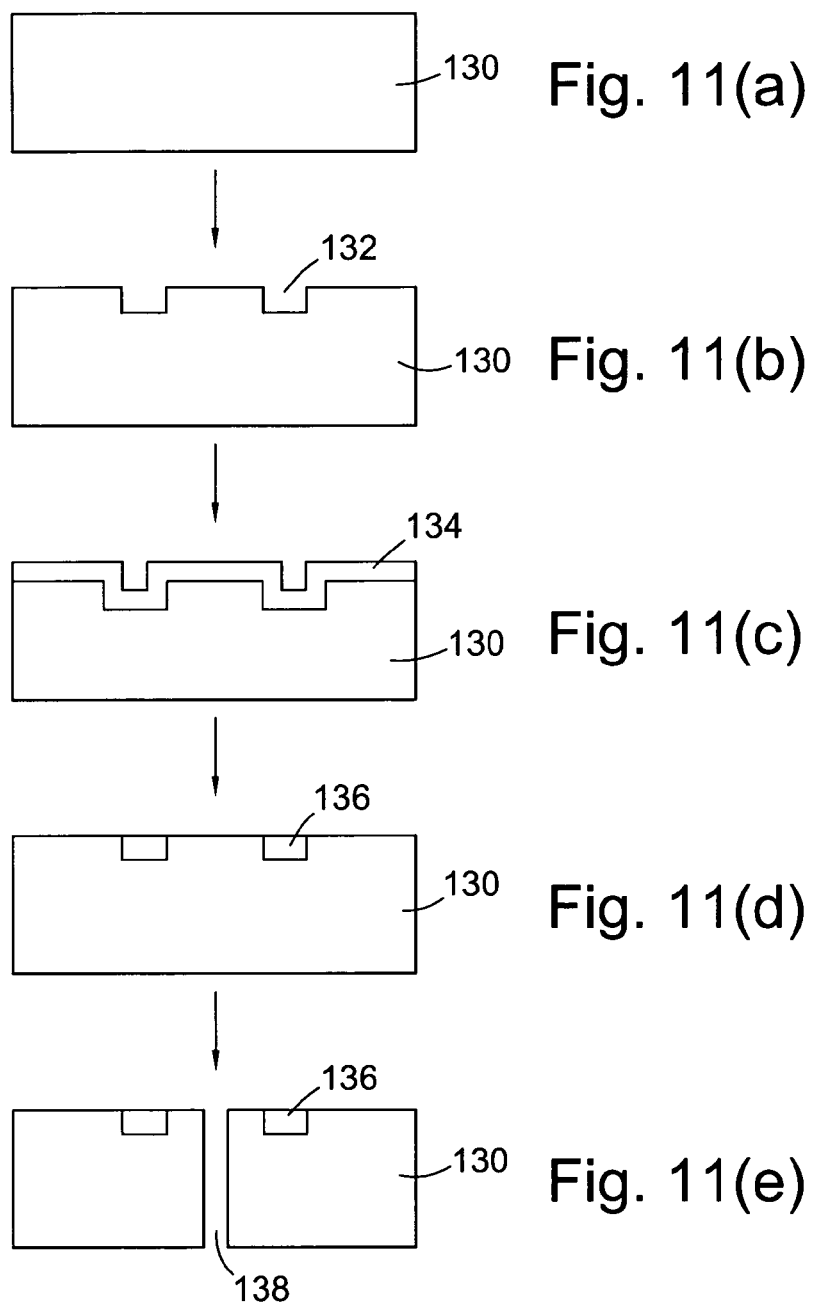

MICROFLUIDIC CELL AND A SPIN RESONANCE DEVICE FOR USE THEREWITH

FIELD OF INVENTION

The present invention relates to a microfluidic cell and a spin resonance device for use therewith.

BACKGROUND OF INVENTION

A microfluidic cell generally comprises one or more channels with at least one dimension equal to or less than 1 mm, more particularly in the range 100 nm to 1 mm. In use, a fluid sample is introduced into the one or more channels of the cell and analysed therein. The analysis may involve, for example, using one or more reagents disposed within the cell and arranged to react with at least a portion of the sample introduced into the cell. As such, microfluidic cells can provide integrated, portable analytical devices thereby eliminating time consuming laboratory analysis procedures.

It is also known to couple microfluidic cells with other devices such as protein arrays and mass spectrometers to further enhance analytical functionality. A review of integrated microfluidic technology is provided by D. Erickson and Dongqing Li in the review article "Integrated microfluidic devices" Analytica Chimica Acta 507 (2004) 11-26.

It has been proposed to provide an arrangement for analysing microliter amounts of a fluidic sample using nuclear magnetic resonance for NMR spectroscopy and/or NMR imaging. There are several problems associated with integrating an NMR device into a portable analytical device comprising a microfluidic cell as discussed below.

NMR devices are well known. They function on the principle that certain nuclei possess a quantum spin which generates a magnetic field. By applying a static magnetic field to a sample the spins of these nuclei are preferentially aligned with the applied magnetic field. An oscillating radiofrequency magnetic field is then applied to the sample and the frequency varied. When the oscillating magnetic field comes into resonance with a nuclear spin it flips the nuclear spin to be oriented against the direction of the static magnetic field. This transition leads to a change in the local magnetic field which can be detected. Different nuclei will spin-flip at different frequencies of the applied oscillating magnetic field due to local shielding effects of surrounding electrons and spin-spin interactions between closely spaced nuclear spins. This change in the resonance frequency of a nuclear spin due to the local chemical environment is known as NMR chemical shifting. As such, information regarding the chemical structure of the sample can be derived via an NMR spectrum indicating chemical shift data. Furthermore, if measurements are taken at numerous different positions in the sample by, for example, application of a magnetic field which varies in space, then an NMR image of the sample can be generated as in magnetic resonance imaging (MRI).

Standard NMR devices use inductive radio frequency (rf) pickup coils to both generate the oscillating magnetic field and sense changes in the magnetic field by way of NMR signals due to spin-flipping of a nuclear spin when it comes into resonance with the applied field. However, such pickup coils are very insensitive and thus relatively large sample volumes and a high magnetic field strength, typically produced by a superconducting magnet, are used to improve signal strength and increase the ability to resolve NMR chemical shifts. This results in standard NMR devices being very large and unsuitable for integration into a small, portable analytical device and/or a device which uses small sample volumes.

Alternatives to the use of inductive rf pickups coils are known for use as an NMR signal sensor. For example, magnetometers such as superconducting quantum interference devices (SQUIDs) and alkali-vapour atomic magnetometers have been suggested. However, again these devices are unsuitable for integration into small, portable analytical devices as SQUIDs require cryogenic cooling and alkali-vapour atomic magnetometers require a heated vapour cell.

WO 2009/046350 identifies the aforementioned problems with incorporating known NMR device arrangements into a microfluidic cell and suggests an alternative which uses a solid state magnetoresistive sensor. A magnetoresistive sensor comprises a thin strip of ferrous material in which a change in resistance occurs when a magnetic field is applied perpendicular to the direction of current flow. The change in resistance is measured and is indicative of changes in the localized magnetic field. In this manner, when a magnetoresistive sensor is placed in close proximity to a microfluidic channel which has been polarized by a static magnetic field, and the nuclear spins are repeatedly flipped by applying, for example, an oscillating radio frequency magnetic field, transient changes in the magnetic field strength can be detected. Such a technique can also be used for analysing electron spins, rather than nuclear spins, in an analogous manner using electron spin resonance (ESR).

One problem with the arrangement described in WO 2009/046350 is that although magnetoresistive sensors can be made small for incorporation into a microfluidic cell, they are not sufficiently sensitive to resolve precise chemical shift information without the application of a strong (>1 Tesla) homogeneous field. It is suggested that for less precise measurements more simple magnets may be used to facilitate miniaturization (see paragraph 35 of WO 2009/046350). However, it would appear from the teachings of WO 2009/046350 that a magetoresistive sensor is not sufficiently sensitive to facilitate such miniaturization when precise chemical shift information is desired due to the requirement for a strong homogeneous magnetic field to resolve such information.

It is an aim of certain embodiments of the present invention to provide an alternative arrangement to that suggested in WO 2009/046350 for integrating a spin resonance sensor into a microfluidic cell. It is a further aim to provide an arrangement which is sufficiently sensitive to resolve detailed chemical shift information at lower applied magnetic field strengths thereby facilitating miniaturization without loss of functionality.

SUMMARY OF INVENTION

According to a first aspect of the present invention there is provided a microfluidic cell comprising:
  a microfluidic channel for receiving a fluid sample; and
  a sensor located adjacent the microfluidic channel;
   wherein the sensor comprises a diamond material comprising one or more quantum spin defects.

According to a second aspect of the present invention there is provided a method of manufacturing the aforementioned microfluidic cell, the method comprising:
  growing a diamond material using a chemical vapour deposition technique;
  forming one or more quantum spin defects in the diamond material; and
  forming a microfluidic channel adjacent the one or more quantum spin defects.

According to a third aspect of the present invention there is provided a spin resonance device comprising:
- a cell receiving bay for receiving a microfluidic cell as described herein;
- a first variable oscillating field generator for manipulating quantum spins within a sample disposed within the microfluidic channel of the microfluidic cell when mounted in the cell receiving bay;
- a second variable oscillating field generator for manipulating the one or more quantum spin defects in the sensor of the microfluidic cell when mounted in the cell receiving bay;
- a light source for optically pumping the one or more quantum spin defects in the sensor of the microfluidic cell when mounted in the cell receiving bay; and
- a detector for detecting emission from one or more decaying quantum spin defects in the sensor of the microfluidic cell when mounted in the cell receiving bay.

According to a fourth aspect of the present invention there is provided a spin resonance device as described herein comprising a microfluidic cell as described herein.

According to a fifth aspect of the present invention there is provided a method of analysing a fluid sample to generate spin resonance data, the method comprising:
- loading a fluid sample into a microfluidic cell as described herein; and
- analysing the fluid sample to generate spin resonance data for the sample.

BRIEF DESCRIPTION OF THE DRAWINGS

For a better understanding of the present invention and to show how the same may be carried into effect, embodiments of the present invention will now be described by way of example only with reference to the accompanying drawings, in which:

FIG. 11 illustrates another alternative method for forming a microfluidic cell according to an embodiment of the present invention.

DETAILED DESCRIPTION OF CERTAIN EMBODIMENTS

Diamond magnetometers have been recently proposed for use in magnetic field microscopes and magnetic imaging. See, for example: C. L. Degen "Scanning magnetic field microscope with a diamond single-spin sensor" Applied Physics Letters 92, 243111 (2008); Steinert et al. "High sensitivity magnetic imaging using an array of spins in diamond", Review of Scientific Instruments 81, 043705 (2010); WO 2009/073736; and WO 2009/073740.

Figure 1A:
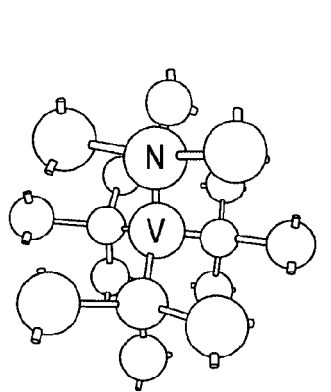
FIG. 1a illustrates the atomic structure of an $NV^-$ defect.
Figure 1B:
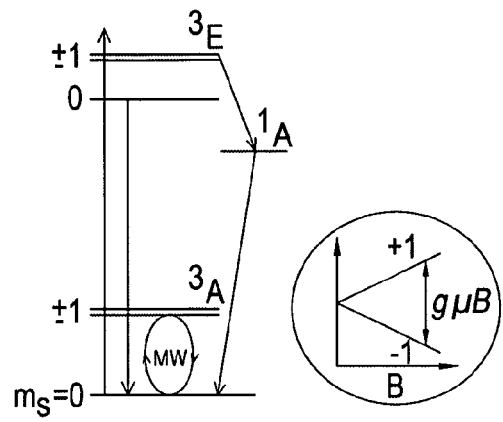
FIG. 1b illustrates the electronic structure of an $NV^-$ defect.
Figure 2A:
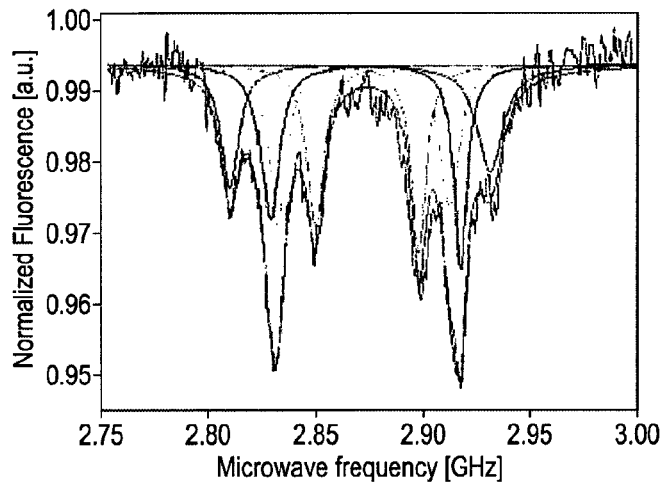
FIG. 2a illustrates a characteristic fluorescence spectrum obtained from a plurality of $NV^-$ defects manipulated by a varying microwave frequency.

The aforementioned documents propose the use of nitrogen-vacancy ($NV^-$) defects in a high purity single crystal diamond material as probe spins for sensing a magnetic field and monitoring the probe spins using optically detected magnetic resonance (ODMR). As described in the Steingert et al. paper, the $NV^-$ defect in diamond consists of a substitutional nitrogen atom adjacent to a carbon vacancy as shown in FIG. 1a. Its two unpaired electrons form a spin triplet in the electronic ground state ($^3A$), the degenerate $m_s=\pm1$ sublevels being separated from the $m_s=0$ level by 2.87 GHz. The electronic structure of the $NV^-$ defect is illustrated in FIG. 1b from Steingert et al. The $m_s=0$ sublevel exhibits a high fluorescence rate when optically pumped. In contrast, when the defect is excited in the $m_s=\pm1$ levels, it exhibits a higher probability to cross over to the non-radiative singlet state ($^1A$) followed by a subsequent relaxation into $m_s=0$. As a result, the spin state can be optically read out, the $m_s=0$ state being "bright" and the $m_s=\pm1$ states being dark. When an external magnetic field is applied, the degeneracy of the spin sublevels $m_s=\pm1$ is broken via Zeeman splitting. This causes the resonance lines to split depending on the applied magnetic field magnitude and its direction. This dependency can be used for vector magnetometry as the resonant spin transitions can be probed by sweeping the microwave (MW) frequency resulting in characteristic dips in the optically detected magnetic resonance (ODMR) spectrum as shown in FIG. 2a from Steinert et al.

Figure 2B:
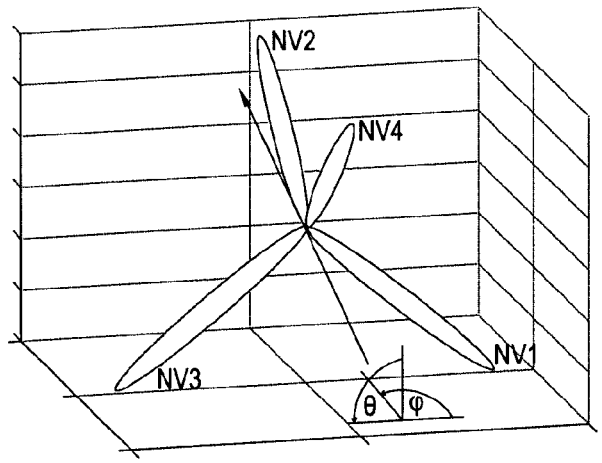
FIG. 2b illustrates the orientation of four crystallographic $NV^-$ axes in a diamond crystal.

Steinert et al. employed ion implantation to create a homogenous layer of negatively charged $NV^-$ centres into an ultrapure [100] type IIa diamond. The ensemble $NV^-$ sensor was found to offer a higher magnetic sensitivity due to the amplified fluorescence signal from a plurality of sensing spins. Another option is vector reconstruction since the diamond lattice imposes four distinct tetrahedral $NV^-$ orientations as shown in FIG. 2b from Steinert et al. The magnetic field projections along each of these axes can be measured as a single composite spectrum and a numerical algorithm used to reconstruct the full magnetic field vector. The magnitude (B) and orientation ($\theta_B$, $\phi_B$) of the external magnetic field can be calculated by analyzing the ODMR spectra based on an unconstrained least-square algorithm.

The present inventors have realized that the principles disclosed in Steinert et al. may be combined with the principles of microfluidic devices and the principles of spin resonance devices to provide a spin resonance device which is sufficiently sensitive to resolve detailed chemical shift information at low applied magnetic field strengths therefore facilitating miniaturization without loss of functionality. As such, the present invention lies in the realisation that a diamond sensor can be integrated into a microfluidic cell in such a manner as to allow the construction of a small, portable microfluidic spin resonance device.

Certain embodiments of the present invention provide a microfluidic cell comprising: a microfluidic channel for receiving a fluid sample; and a sensor located adjacent the microfluidic channel; wherein the sensor comprises a diamond material comprising one or more quantum spin defects. Certain embodiments may be manufactured using a method comprising: growing a diamond material using a chemical vapour deposition technique; forming one or more quantum spin defects in the diamond material; and forming a microfluidic channel adjacent the one or more quantum spin defects.

Diamond Sensor Materials

The diamond material of the sensor is preferably a single crystal diamond material although polycrystalline diamond material is also envisaged as an alternative option. The single crystal diamond material may comprise a single crystal diamond having at least one dimension equal to or greater than 0.5 mm, 1 mm, 2 mm, or 3 mm. The diamond material may be formed using a chemical vapour deposition (CVD) technique.

Suitable diamond materials and methods for manufacturing such materials for the diamond sensor are described in WO 2010/010352, WO 2010/010344, WO 2009/105814, WO 2009/105815, WO 2010/003179 and US 2009/0214169.

Preferably the diamond material should be high quality "quantum grade" diamond material such as that described in WO 2010010344 and WO 2010010352. The term "quantum grade" diamond is used herein for diamond material which is suitable for use in applications that utilize the material's quantum spin properties. Specifically, the quantum grade diamond material's high purity makes it possible to isolate single defect centres using optical techniques known to the person skilled in the art.

At least a portion of the diamond sensor is preferably grown using a gas phase having a nitrogen concentration of less than or equal to 250 parts per billion, 200 parts per billion, 150 parts per billion, or 120 parts per billion, calculated as molecular nitrogen. The decreased nitrogen content in the gas within the CVD reactor results in a decreased nitrogen content within the CVD diamond material, and therefore a lower absorption coefficient and longer decoherence times. The nitrogen content within the CVD reactor gas may be more than 0.001 parts per billion, more than 0.01 parts per billion, more than 0.1 parts per billion, more than 1 part per billion, or more than 10 parts per billion.

The CVD growth process may use source gases of high isotopic purity in addition to high chemical purity. For example the carbon source gas may have a $^{12}C$ fraction increased so as to be equal to or greater than 99%, 99.3%, 99.6%, 99.9%, 99.99%, or 99.999%. This can further increase the decoherence time of the single photon emitters although it is also envisaged that a natural abundance of $^{12}C$ may be used.

In light of the above, the diamond sensor may be formed of a diamond material having at least one high purity portion comprising one or more of: a neutral single substitutional nitrogen concentration equal to or less than 20 ppb, 10 ppb, 5 ppb, 1 ppb or 0.5 ppb; an NV concentration equal to or less than 0.15 ppb, 0.1 ppb, 0.05 ppb, 0.001 ppb, 0.0001 ppb, or 0.00005 ppb; and a total concentration of $^{13}C$ equal to or less than 0.9%, 0.7%, 0.4% 0.1%, 0.01%, or 0.001%. The diamond sensor may comprise at least one portion of such material in the form of a layer having a thickness equal to or greater than 0.1 µm, 1 µm, 10 µm, 100 µm, 200 µm, or 500 µm.

The gas composition used in the CVD growth process might also include other impurities related to the formation of colour centres or their charge stabilization such as, for example, silicon or phosphorous. However, according to certain embodiments in addition to low nitrogen concentrations, the CVD growth process preferably also uses a gas composition which has very low concentrations of other impurities which may be incorporated into the diamond material during CVD growth. Accordingly, at least a portion of the diamond material preferably has one or more of: a boron concentration of 100 ppb or less; a silicon concentration of 100 ppb or less; a concentration of paramagnetic defects of 1 ppm or less; a concentration of any single non-hydrogen impurities of 5 ppm or less; a total impurity content excluding hydrogen and its isotopes of 10 ppm or less; and a concentration of hydrogen impurities in the single crystal diamond host material of $10^{18}$ cm$^{-3}$ or less. The high purity material preferably also has a low concentration of dislocations. For example, the high purity single crystal diamond material may contain a dislocation bundle density equal to or less than: $10^6$ dislocations cm$^{-2}$; $10^4$ dislocations cm$^{-2}$; $3 \times 10^3$ dislocations cm$^{-2}$; $10^3$ dislocations cm$^{-2}$; $10^2$ dislocations cm$^{-2}$; or 10 dislocations cm$^{-2}$. This can be achieved by careful substrate preparation and the use of nitrogen to inhibit the formation of dislocations which could otherwise propagate through the high purity diamond material.

It is also desirable to process a surface of the diamond material so as to achieve a low surface roughness Rq. As described in WO 2010010344 and WO 2010010352, high T2 values and high spectral stability can be obtained using the synthetic diamond material of the present invention as a host material where the quantum spin defect is to be positioned at a distance of equal to or less than 100 µm from such a processed surface. According to embodiments of the present invention the quantum spin defect should preferably be positioned at a distance of equal to or less than 100 µm, preferably 50 µm, preferably 20 µm, preferably 10 µm, preferably 1 µm, preferably 500 nm, preferably 200 nm, preferably 50 nm, preferably 20 nm, or preferably 10 nm from such a processed surface. This positioning of the quantum spin defect means that it is readily accessible for end applications such that it can be characterised and "read out", for example, by optical coupling to a waveguide. Thus, it is advantageous to form a quantum spin defect in the quantum grade single crystal diamond, wherein a surface of the diamond material is processed such that the surface roughness, Rq of the single crystal diamond within an area defined by a circle of radius of about 5 µm centred on the point on the surface nearest to where the quantum spin defect is formed is equal to or less than about 10 nm, 5 nm, 1 nm, or 0.5 nm. The surface may be processed before or after forming the quantum spin defect. In the microfluidic cell arrangement discussed herein, the quantum spin defects may be formed close to a surface of the diamond sensor forming at least a portion of the microfluidic channel. Accordingly, this surface may be processed to have a low surface roughness.

In additional to low surface roughness at a surface near a quantum spin defect, it is also useful to ensure that sub-surface damage is low near a quantum spin defect. Sub-surface damage may be reduced by etching, such as with a plasma etch. It may also be useful to control the type of surface termination at a diamond surface near the quantum spin defect to ensure that the diamond is not terminated with a species which will adversely interact with the quantum spin defect. For example, it may be useful to ensure that the diamond surface near the quantum spin defect is terminated with a spin-zero species such as oxygen, rather than a species which has a non-zero spin such as hydrogen or those species which might lead to some surface charge redistribution processes (such as that known to occur with hydrogen).

High purity (chemical and/or isotopic) diamond material is preferred as the decoherence time, and thus the sensitivity, of the one or more quantum spin defects is affected by the presence of other spin-active species within the single crystal diamond crystal. A low dislocation density is also important as strain in the diamond crystal can also affect the decoherence time, and thus the sensitivity, of the one or more quantum spin defects. Low dislocation density can also be important for reducing strain and ensuring that a good quality channel can be formed in the single crystal diamond material. Low and uniform strain is desirable to avoid any Stark broadening or shifting of quantum spin defect optical emission from one quantum spin defect to the next. In one form, the one or more quantum spin defects can also act as a measure of electric field. In such a configuration, it is also desirable to have low and uniform strain.

The sensor may be formed using a multi-stage growth process whereby the sensor has both lower quality and higher quality diamond material disposed therein with the one or more quantum spin defects disposed in the higher quality diamond material. For example, a first layer of single crystal diamond material may be grown using a gas phase having a nitrogen concentration of greater than or equal to 300 parts per billion (ppb) and less than or equal to 5 parts per million (ppm), calculated as molecular nitrogen. A second layer may be grown using a gas phase having a nitrogen concentration of greater than or equal to 0.001 ppb and less than or equal to 250 ppb, calculated as molecular nitrogen. The second layer may also be grown using a gas phase having a carbon source gas comprising $^{12}C$ in a natural abundance or in an amount of at least 99% of the total C content of the carbon source gas. The second layer may comprise high purity quantum grade diamond material as previously discussed. The first layer will comprise lower grade diamond material constituting at least one further portion of the diamond material which is formed of a single crystal diamond material having one or more of: a single substitutional nitrogen concentration equal to or greater than 30 ppb, 50 ppb, 100 ppb, 200 ppb, 300 ppb, 500 ppb, 700 ppb, or 800 ppb; an $NV^-$ concentration equal to or greater than 0.3 ppb, 0.5 ppb, 1 ppb, 2 ppb, 3 ppb, 5 ppb, 7 ppb, or 8 ppb; and a natural abundance of $^{13}C$. The at least one further portion may have a neutral single substitutional nitrogen concentration greater that the at least one portion by a factor of at least 5, 10, 20, 50, 100, 500, 1000, or 10000. The at least one further portion may also have one or more of: a neutral single substitutional nitrogen concentration equal to or less than 5 ppm, 2 ppm, or 1 ppm; and an $NV^-$ concentration equal to or equal to or less than 50 ppb, 20 ppb, or 10 ppb. The diamond material may be formed of a single crystal diamond including both the at least one portion and the at least one further portion whereby the portions are coupled together by being incorporated into the single crystal diamond.

One or more quantum spin defects may be formed in the second layer either by implantation or in situ growth. A third layer may then be grown over the second layer using the same growth conditions as for the first layer. A channel can then be formed through the composite diamond structure substantially parallel and close to the one or more quantum spin defects to form the microfluidic cell.

One problem with the aforementioned approach is that if the channel is formed by cutting or etching a hole through a diamond crystal, it is then difficult to polish the interior wall of the channel. Because it is advantageous to provide a low roughness surface adjacent the one or more quantum spin defects, one possibility is to grow a high purity layer of CVD diamond, implant or grow in the one or more quantum spin defects, and polish the surface. This polished surface is to form one wall of the microfluidic channel. An additional element, which could be formed of diamond or some other material, can then be bonded to the polished diamond surface to form the microfluidic channel.

Alternatively, a smooth surface in a channel can be achieved using laser trepanning where operating parameters such as the traverse rate and the pulse rate are chosen to give the required surface finish. Alternatively still, the internal surface of a channel can be processed after being made by laser, for example by techniques used in the fabrication of diamond wire drawing dies, such as polishing the internal surface with a reciprocating wire having a diameter slightly smaller than the passage diameter in a slurry of fine diamond powder.

Quantum Spin Defects

The one or more quantum spin defects are preferably $NV^-$ defects although in principle they could comprise other types of quantum spin defect in single crystal diamond material. The term "quantum spin defect" as used herein refers to a defect within a single crystal diamond material which possesses a quantum spin suitable for sensing a magnetic or electric field. Other possible diamond defects of interest for use in embodiments of the present invention include extrinsic defects such as those based on hydrogen, chromium, nickel, silicon, or phosphorus and intrinsic defects such as vacancies, interstitials, and vacancy pairs or clusters. However, $NV^-$ defects have been found to be particularly useful as they can be optically pumped into a ground state electronic spin configuration at room temperature to prime the sensor without requiring cryogenic cooling to account for a thermal distribution of electronic states. Furthermore, the electronic spin states of the $NV^-$ defect can be manipulated using microwaves and read-out by sensing changes in the fluorescence spectrum as previously described in Steinert et al. Further still, the $NV^-$ defect has a long decoherence time $T_2$ which is useful as sensitivity to a change in the magnetic or electric field in a sample is related to decoherence time. The one or more quantum spin defects may have a decoherence time $T_2$ equal to or greater than 0.05 ms, 0.1 ms, 0.3 ms, 0.6 ms, 1 ms, 5 ms, or 15 ms, with corresponding $T_2^*$ values equal to or less than 400 μs, 200 μs, 150 μs, 100 μs, 75 μs, 50 μs, 20 μs, or 1 μs.

The one or more quantum spin defects may be positioned at a distance from the microfluidic channel equal to or less than: 100 nm; 80 nm; 50 nm; 20 nm; or 10 nm. It can be advantageous that the quantum spin defects are positioned close to the microfluidic channel in order to increase sensitivity to changes in the magnetic or electric field within the sample. Furthermore, when a plurality of quantum spin defects are provided, the spatial distance between the quantum spin defects and the contents of the microfluidic channel may be made as constant as possible to minimise the complexity of deconvoluting data from the quantum spin defects. One can envisage a number of geometries to do this, many of which require multi-stage growth and processing as discussed in more detail later in this specification. One criteria is that the separation of controlled regions of quantum spin defects from the microfluidic channel, and the extent of the controlled regions of quantum spin defects in directions not parallel to the microfluidic channel, are preferably of a similar order of magnitude to the diameter of the microfluidic channel itself. This is one reason for making the channel very narrow.

Quantum spin defects, for example $NV^-$, can be grown in or created through implantation techniques as is known in the art. There are several distinguishing characteristics associated with $NV^-$ defects produced using implantation and annealing rather than growth alone. These include, for example, the presence of the vacancy centre (GR1) at 741 nm and the same defect in the negative charge state at 394 nm, which are a leftover of the implantation route for making NV⁻ defects.

The one or more quantum spin defects may be implanted in a layer of diamond material near a surface of the sensor adjacent the microfluidic channel. The quantum spin defects may be implanted before or after formation of the channel. Alternatively, the quantum spin defects may be grown into the diamond material during a chemical vapour deposition growth stage. One advantage of using an implantation method is that the one or more quantum spin defects can be accurately positioned relative to the channel in order to optimize the location of the one or more quantum spin defects relative to the channel for sensing changes in the magnetic or electric field within a sample located in the channel. For example, a line, band, or layer of defects may be formed close to the channel for sensing changes in the magnetic or electric field in a sample within the channel. Alternatively, the one or more quantum spin defects may be grown into the diamond material during a chemical vapour deposition method for making the diamond material of the sensor. One advantage of this approach is that the diamond material is not subject to damage which may occur during an implantation technique. Such damage can affect the quality of a quantum spin defect by, for example, decreasing decoherence time $T_2$, and thus affect the sensitivity of the sensor. However, it may be more difficult to position the microfluidic channel at a desired location relative to the quantum spin defects. In this regard, the concentration and volume of the quantum spin defect containing region can be selected such that it will be statistically probable that one or more quantum spin defects will be located at or near the desired position relative to the microfluidic channel.

The diamond sensing element may be formed by growing a high purity single crystal CVD diamond, forming a line, band, or layer of quantum spin defects in the high purity single crystal CVD diamond (by implantation or in situ growth), and forming a channel substantially parallel to the line, band, or layer of quantum spin defects at a distance of 100 nm or less from the line, band, or layer of quantum spin defects. The relative location of the one or more quantum defects and the channel can be controlled by controlling the position at which the channel is formed relative to the one or more quantum spin defects. For example, one or more quantum spin defects can be located within the single crystal diamond material and then the channel formed at a suitable position adjacent the one or more quantum spin defects. Alternatively, the channel may be formed and then the one or more quantum spin defects formed at a suitable position adjacent the channel. For example, an open groove may be formed in the diamond material and one or more quantum spin defects implanted directly into a wall of the groove along its length. A further layer of material, which may be diamond or some other material, can then be disposed over the open groove to seal the groove and form the microfluidic channel.

Various possible distributions of quantum spin defects about the microfluidic channel may be envisaged. Providing a plurality of quantum spin defects along the length of the microfluidic channel can improve sensitivity. Providing a ring of quantum spin defects around the microfluidic channel at one or more locations along the microfluidic channel can give good spatial resolution for taking measurements at one or more specific locations along the channel. For example, a layered diamond structure may be formed including spaced apart layers comprising quantum spin defects interspersed with layers of diamond comprising substantial no quantum spin defects. A hole may then be formed through the layered structure to form a microfluidic channel. Such a microfluidic channel will be surrounded by spaced apart rings of quantum spin defects along its length. This may be advantageous for arrangements in which the fluid sample flows along the microfluidic channel and time spaced measurements are required, for example to monitor the progress of a chemical reaction.

In relation to the above, it should be noted that the measurement time required using quantum spin defects is very short (of the order of milliseconds or less). As such, it is possible to take measurements of a fluid under flow conditions. This enables a plurality of time spaced measurements to be taken along the microfluidic channel in order to monitor the progress of a chemical reaction. The reaction could be ongoing on entry to the microfluidic cell, initiated by a second channel in the microfluidic cell feeding in additional chemistry, or initiated by light, heat or any other external influence which can be applied through diamond.

Microfluidic Cell Structure

The diamond material forming the sensor preferably forms at least a portion of a wall defining the microfluidic channel. The microfluidic channel may be formed by a hole through the diamond material such that the channel is defined by the hole. The channel may, for example, be cut using a laser or etched into the diamond material. As such, the microfluidic cell may be formed entirely, or at least substantially, of the diamond material. Alternatively, the cell may comprise a substrate of a different material, with the channel defined over the substrate and the diamond sensor positioned on the substrate adjacent the channel. A further layer of substrate material may form a top layer to complete the channel with the diamond sensor disposed between the layers of substrate material and adjacent the channel. Yet another alternative is to form the channel in a surface of the diamond sensor and complete the channel with a layer of substrate material. The substrate material on one side of the microfluidic channel may be the same or different to the substrate material on the other side of the microfluidic channel.

Other arrangements for constructing the microfluidic cell may be envisaged. The only restriction is that the quantum spin defects lie in the diamond material. However, it is advantageous that if any other material is used for constructing the microfluidic cell it does not provide spurious signals from nuclear spins. For example, in principle the microfluidic channel can be formed in a material other than diamond, and a thin sliver of diamond used for the sensor(s). In practice, other materials should preferably be free of nuclear spins and this makes diamond a good material for forming both the microfluidic channel and the sensor. If any materials which comprise nuclear spins are utilized in constructing the microfluidic cell, they should preferably be spaced apart from the quantum spin defects in the diamond material to avoid interference.

Another consideration is that advantageously the microfluidic cell should be made of materials which are readily cleaned and reused. Diamond is particularly useful as it is chemical and thermally robust and thus can be subjected to acid cleaning and/or autoclaving between uses.

Figure 3:
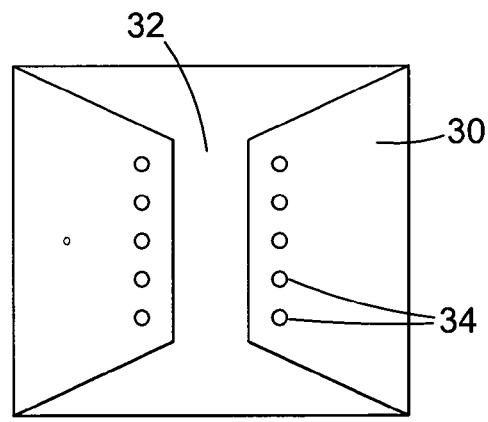
FIG. 3 shows a microfluidic cell according to an embodiment of the present invention.

FIG. 3 shows an embodiment of a diamond based microfluidic cell according to one embodiment of the presently claimed invention. The microfluidic cell comprises at least one diamond sensor 30 positioned adjacent a channel 32 into which a fluid sample can be disposed. The at least one diamond sensor 30 comprises one or more quantum spin defects 34, such as NV⁻ defects, which are positioned adjacent the channel 32 to sense changes in the magnetic and/or electric field within a sample located in the channel 32. The illustrated embodiment comprises two diamond sensing elements 30 placed on opposite sides of the channel 32. However, it is envisaged that the microfluidic cell may comprise only one or alternatively a plurality of diamond sensing elements.

The microfluidic channel preferably has at least one dimension equal to or less than 1 mm, more particularly in the range 100 nm to 1 mm, optionally in the range 500 nm to 500 µm. The size of the microfluidic channel may be chosen to be selective of certain species. More than one channel may be provided. The different channels may have different sizes to be selective of different species based on differences in the size of the species.

A number of possible techniques for cutting microfluidic channels in diamond are known. The lower limit for the diameter of the passages, and in particular the analysis passages, is defined by the technique used for their fabrication. In the case of diamond, one technique is to use a yttrium-aluminium-garnet (YAG) laser at a wavelength of approximately 1 µm. With such a laser, the minimum theoretical size of channel would be that produced by a diffraction-limited spot i.e. approximately equal to the wavelength. However, the practical lower limit is about 5 µm. A further embodiment uses a KrF excimer laser producing ultraviolet radiation with a wavelength of about 193 nm to fabricate the channels. The shorter wavelength compared with YAG lasers allows the passages to be of smaller diameter, possibly as low as 0.5 µm.

Whilst the use of a YAG laser for fabricating the passages is preferred, this does not exclude the use of alternative techniques such as wavelength tripled 355 nm solid state lasers, other solid state lasers, dye-lasers or other laser systems. A further alternative is the use of electron beams, which are known in the art to be capable of producing very fine holes in diamond. Alternatively, the channels may be formed by using mask and etch technology.

Spin Resonance Device

A spin resonance device for use with the aforementioned microfluidic cell comprises: a cell receiving bay for receiving a microfluidic cell comprising a diamond sensor including one or more quantum spin defects; a light source for optically pumping the one or more quantum spin defects; and a detector for detecting emission from one or more decaying quantum spin defects.

Figure 4:
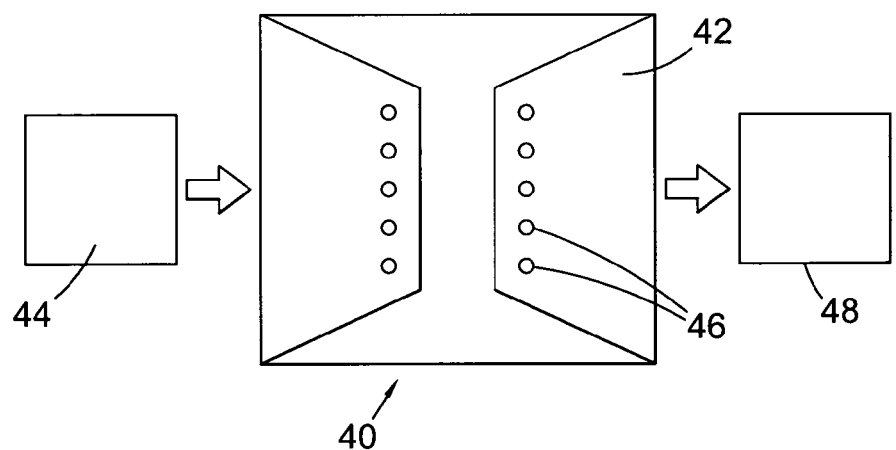
FIG. 4 shows a schematic diagram of a spin resonance device according to an embodiment of the present invention.

Such an arrangement is illustrated in FIG. 4 which comprises a microfluidic cell 40 including at least one diamond sensor 42, a light source 44 such as a laser source configured to excite one or more quantum spin defects 46 in the at least one diamond sensor 42 of the microfluidic cell 40, and a detector 48 for detecting emission from one or more decaying quantum spin defects.

Figure 5:
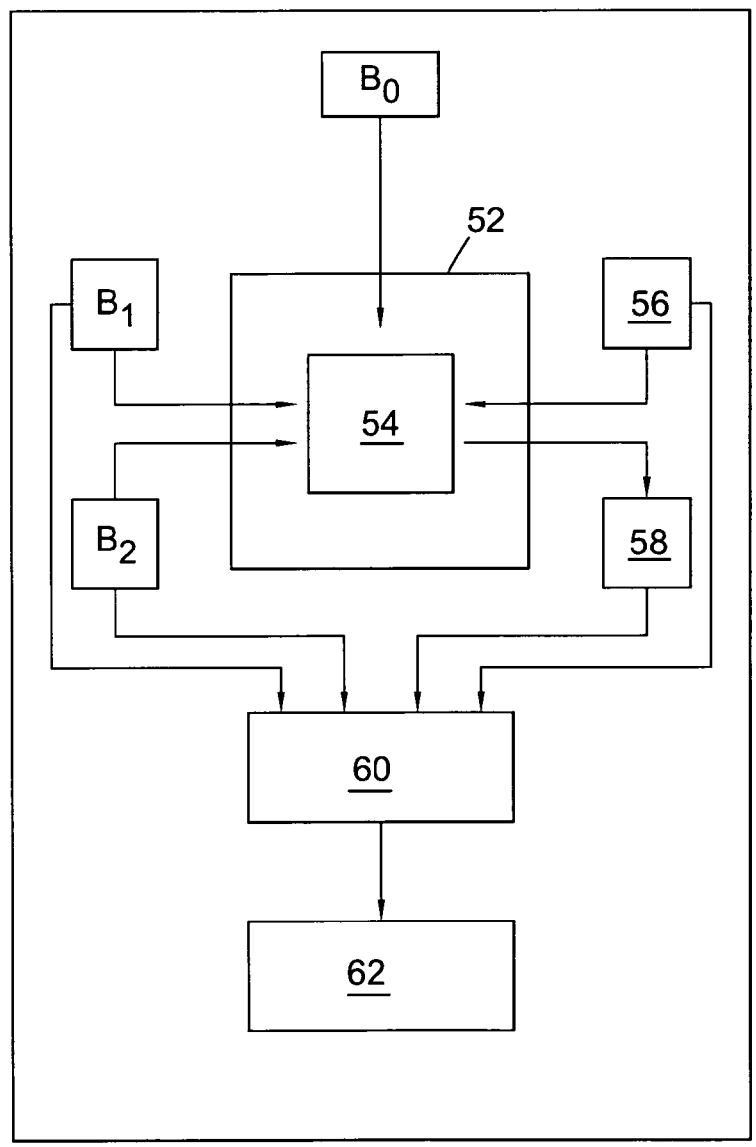
FIG. 5 shows a more detailed schematic diagram of a spin resonance device according to an embodiment of the present invention.

FIG. 5 shows a schematic diagram of a spin resonance device according to an embodiment of the present invention. The spin resonance device comprises a static magnetic field generator ($B_0$), a first variable oscillating magnetic field generator ($B_1$) and a second variable oscillating magnetic field generator ($B_2$). The first variable oscillating magnetic field generator ($B_1$) is preferably a radio frequency generator and the second oscillating variable magnetic field generator ($B_2$) is preferably a microwave generator. The device may further comprise magnetic shielding 52 disposed around a cell receiving bay 54. In one arrangement the earth's magnetic field is used as a static magnetic field and thus no additional static magnetic field generator is required. In such an arrangement, the shielding may be adapted to shield the sensor from any external oscillating fields but not against a static magnetic field. Such shielding is known to those skilled in the art. The spin resonance device also comprises a light source 56 configured to excite quantum spin defects in a diamond based microfluidic cell mounted in the cell receiving bay 54 and an optical detector 58 for detecting optical output signals from the quantum spin defects in the diamond based microfluidic cell. The light source may be a laser light source. The light source may be configured to selectively excite quantum spin defects at different positions along the microfluidic channel to allow analysis of fluid at different positions along the channel. Alternatively or additionally, the detector may be configured to selectively detect emission from quantum spin defects at different positions along the microfluidic channel to allow analysis of fluid at different positions along the channel.

In an alternative arrangement, the previously described magnetic field generators may be replaced with electric field generators. The electronic structure of defects such as the NV centre is such that embodiments of the present invention can also be used to measure electric fields as an alternative to, or in addition to, magnetic fields.

One or more processors 60 may be disposed within the spin resonance device and linked to the detector 58 to receive and process emission data. The one or more processors 60 may be linked to an output 62 for outputting results. The output 62 may comprise a display screen for displaying spin resonance data. The one or more processors 60 and the display 62 may be integrated into the spin resonance device. Alternatively, or additionally, the output 62 may be adapted for transmitting data to an external device such as a laptop or desktop computer for processing and displaying data.

According to a further aspect of the present invention a spin resonance device is provided with an integrated microfluidic cell. According to one arrangement the fluid sample may be injected into the microfluidic cell and the cell then placed into the spin resonance device for analysis of the sample. According to another arrangement the microfluidic cell is mounted into the spin resonance device and the sample is injecting into the microfluidic cell through an injection port within the spin resonance device. In the latter case, the spin resonance device is adapted to have an injection port configured for injecting a fluid sample into the microfluidic cell disposed within the spin resonance device.

The microfluidic spin resonance device functions as follows.

A sample within the microfluidic channel is subjected to a static magnetic field $B_0$. By applying a static magnetic field $B_0$ to a sample the spins of nuclei within the sample are preferentially aligned with the applied magnetic field. An oscillating radiofrequency magnetic field $B_1$ is then applied to the sample and the frequency varied. When the oscillating magnetic field $B_1$ comes into resonance with a nuclear spin it flips the nuclear spin to be oriented against the direction of the static magnetic field $B_0$. This transition leads to a change in the local magnetic field which can be sensed and detected. Different nuclei will spin-flip at different frequencies of the applied oscillating magnetic field $B_1$ due to local shielding effects of surrounding electrons and spin-spin interactions between closely spaced nuclear spins.

So far, the described device functions like a standard NMR device but with a much smaller sample volume and a much lower static magnetic field allowing the use of a small magnet (or indeed no magnet if the earth's magnetic field is used) and thus allowing miniaturization of the device as a whole. In contrast to a standard NMR device, changes in the local magnetic field resulting from nuclear spin flipping are detected using one or more quantum spin defects disposed in high purity diamond material located adjacent the microfluidic channel as described below with reference to $NV^-$ defects.

NV⁻ defects are disposed within the previously described static magnetic field $B_0$. Accordingly, the degeneracy of the electron spin states $m_s=\pm 1$ within the NV⁻ defects is split in a manner as described by Steinert et al. The NV⁻ defects are excited with an optical laser source at 532 nm causing excitation of electrons from the $^3A$ ground state to the $^3E$ excited state. The excited $m_s=0$ electrons fluoresce on transition back to the ground state emitting and this fluorescence is detected. An oscillating microwave field is applied to the NV⁻ defects and the frequency varied. When the oscillating microwave field comes into resonance with the electron spin of an NV⁻ centres it causes an electron to undergo a transition to $m_s=1$ state. The resonant spin transitions can be probed by sweeping the microwave (MW) frequency resulting in characteristic dips in the optically detected magnetic resonance (ODMR) spectrum as previously described by Steinert et al. with reference to FIG. 2a.

Now, the energy of the $m_s=\pm 1$ state will be dependent on the static magnetic field $B_0$ but will be perturbed by local variations in the magnetic field caused by the nuclear spin flipping in the sample induced by the oscillating rf magnetic field. As such, the microwave frequency at which electron spin resonance will occur in the NV⁻ defects will be shifted when nuclear spins in the sample come into resonance with the oscillating rf field. These changes are detected by a shift in the dip at which fluorescence occurs. As such, nuclear spin resonance in the microfluidic sample is optically detected via changes in the electron spin resonance in the NV⁻ defects. The optical signal can thus be processed to generate NMR data. This may be in the form of an NMR spectrum indicating chemical shift data. Alternatively, or additionally, a magnetic resonance image (MRI) can be generated for a sample if a plurality of optical readings is taken at different positions along the channel. Alternatively, or additionally, changes in the electric field can be measured using this technique.

The data may be displayed on a display screen of the spin resonance device. Alternatively, data may be transmitted, either wired or wirelessly, to an external device such as a laptop or desktop computer for processing and display. In this case, the processing and display within the spin resonance device can be simplified and reduced in size and cost. A suitable computer program can be provided to run on a standard computer for receiving, processing and displaying data gathered by the portable spin resonance device.

Figure 6:
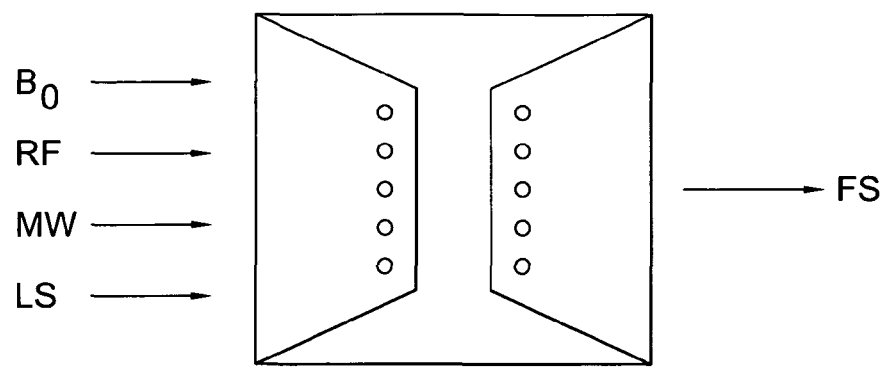
FIG. 6 illustrates input and output signals for analysing a fluid sample loaded into a microfluidic cell comprising a diamond sensor according to an embodiment of the invention.

FIG. 6 illustrates the input and output signals for analysing a fluid sample loaded into a microfluidic cell comprising a diamond sensor according to an embodiment of the invention. The input signals comprise a static magnetic field ($B_0$) for splitting the degeneracy of the $m_s=\pm 1$ electron spin states in the quantum spin defects of the diamond sensor and for splitting degenerate nuclear spin states in the fluid sample, a variable radio frequency magnetic field (RF) for manipulating nuclear spin states in the fluid sample, a variable microwave frequency magnetic field (MW) for manipulating electronic spin states in the diamond sensor, a excitation light source (LS) for exciting electrons within the quantum spin defects in the diamond sensor into an excited state, and a fluorescent signal (FS) from decaying spin states in the quantum spin defects.

As an alternative, or in addition to, the use of high purity quantum grade single crystal diamond material to improve the decoherence time of the one or more quantum spin defects within the diamond material, a suitable pulse sequence may be selected and utilized to increase decoherence time. As such, the spin resonance device may be configured to impart a pulsed signal to the one or more quantum spin defects in the sensor to increase decoherence time and thus improve sensitivity. A typical pulse sequence would comprise a $\pi/2$ pulse followed by a $\pi$ pulse followed by another $\pi/2$ pulse.

Alternative Microfluidic Cell Structures

Figure 7:
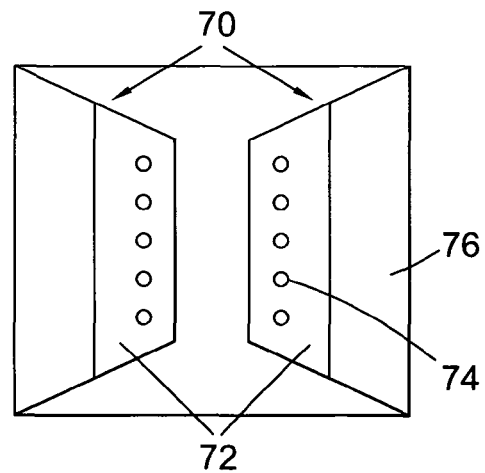
FIG. 7 shows a microfluidic cell according to another embodiment of the present invention.

FIG. 7 shows a microfluidic cell according to another embodiment of the present invention. In this arrangement, at least one diamond sensing element 70 is composed of a high purity quantum grade diamond layer 72 in which one or more quantum spin defects 74 are disposed. The at least one diamond sensing element 70 also comprising a second layer of lower grade diamond material 76. The lower grade diamond material 76 and the higher grade diamond material 72 preferably form a single crystal diamond material. Such an arrangement may be manufactured using a multistage CVD growth process as illustrated in FIG. 8.

Figure 8:
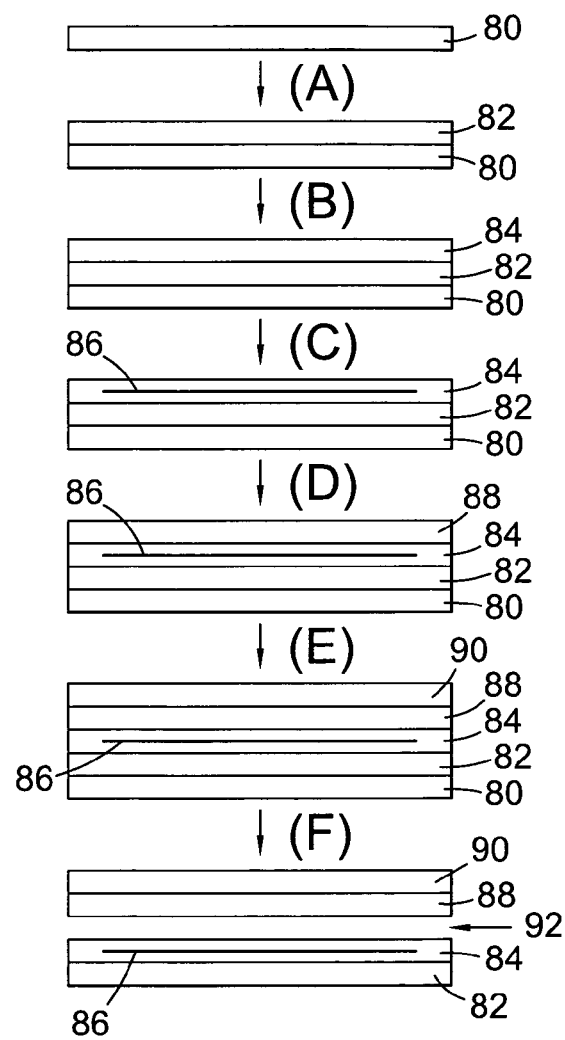
FIG. 8 shows a stepwise process for forming a diamond based microfluidic cell according to an embodiment of the invention.

FIG. 8 shows the stepwise process for forming a diamond based microfluidic sensor according to an embodiment of the invention.

In Step (A) a layer of relatively low purity single crystal diamond material 82 is grown on a substrate 80.

In Step (B) a second layer of higher purity quantum grade diamond 84 is grown in situ over the lower grade layer of single crystal CVD diamond 82.

In step (C) one or more quantum spin defects 86 are formed near an upper surface of the quantum grade diamond material. This may be via implantation or via direct growth by, for example, increasing the nitrogen concentration to grow NV defects into the CVD diamond material (an anneal may be performed at or above 800° C. to mobilize vacancy defects such that they pair with nitrogen defects to form the NV⁻ centres).

The resultant single crystal CVD diamond may be removed, processed to form a low surface roughness finish adjacent the one or more quantum spin defects, and incorporated into a microfluidic cell adjacent a channel of the cell. Alternatively, further CVD diamond growth steps may be performed. For example, in Step (D) a further layer of high purity CVD diamond 88 is grown followed by a further layer of lower grade single crystal diamond material 90 as illustrated in Step (E). In Step (F) the CVD single crystal layered structure is removed from the substrate and a channel 92 is then cut through the diamond crystal adjacent the one or more quantum spin defects 86 to form the microfluidic cell.

Figure 9:
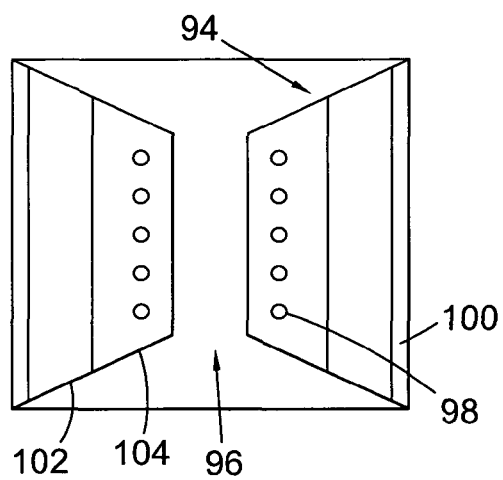
FIG. 9 illustrates a microfluidic cell according to another embodiment of the present invention.
Figure 10A:
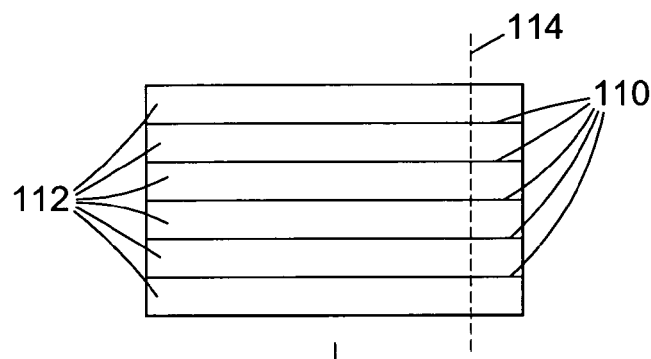
FIG. 10 illustrates an alternative method for forming a microfluidic cell according to an embodiment of the present invention.
Figure 10B:
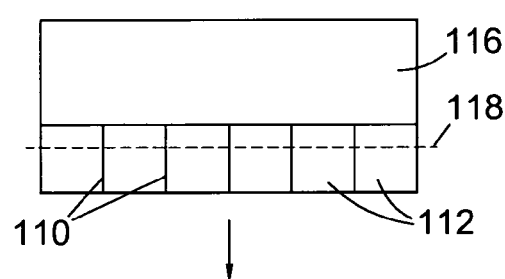
Figure 10C:
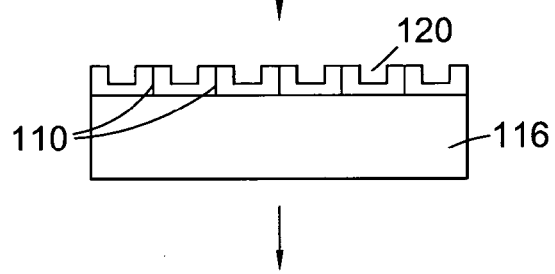
Figure 10D:
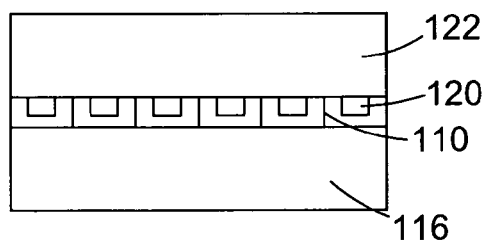

An out-coupling structure may be provided to improve sensitivity. The out-coupling structure may be formed after formation of the diamond body of the sensor or it may be formed during formation of the diamond body of the sensor as an integral part of the process for forming the diamond body of the sensor. The out-coupling structure may, for example, be formed in a diamond surface of the sensor, i.e. the out-coupling structure is integrally formed by a diamond surface of the sensor. FIG. 9 illustrates another embodiment of a microfluidic cell comprising a diamond sensor 94, a channel 96, one or more quantum spin defects 98, and an out-coupling structure 100. The illustrated embodiment comprises a diamond sensor having low and high purity single crystal diamond layers 102, 104 as in the embodiment illustrated in FIG. 7. However, the diamond sensor could, of course, have a more simple structure such as that illustrated in FIG. 3 combined with an out-coupling structure.

The out-coupling structure may comprise one or more of: a convex surface; a microlens array; a solid immersion lens (SIL); a plurality of surface indentations or nano-structures; a diffraction grating; a fresnel lens; and a coating such as an antireflective coating. Furthermore, the out-coupling structure can be positioned to increase out-coupling of light from the one or more quantum spin defects positioned within a portion of high quality single crystal diamond material. A mirror, such as a Bragg mirror, may also be attached, deposited, or etched onto a surface of the sensor to increase out-coupling towards the detector.

FIGS. 10 and 11 illustrate further examples of methods for forming microfluidic cells according to embodiments of the present invention. Both illustrated methods which comprise growing, rather than implanting, the quantum spin defects and address the problem of how to control the spacing between the microfluidic channel and the quantum spin defects.

FIG. 10 illustrates a method for forming a microfluidic cell having a plurality of microfluidic channels and a plurality of lines of defects. Each channel has at least one line of defects uniformly spaced from the channel along its length.

In Step (A), a layered stack of diamond material is grown using a CVD process. Each horizontal line 110 in the stack indicates a thin layer of diamond comprising quantum spin defects. For example, during the growth process the nitrogen content may be periodically raised to form a series of thin layers comprising $NV^-$ defects. These thin quantum spin defect containing layers may be separated by instrinsic diamond layers 112.

Once the layered structure is formed it is cleaved along a vertical line 114, e.g. by laser cutting form a layer comprising a series of lines of quantum spin defects.

In Step (B), the aforementioned layer is used as a substrate to grow a high purity layer of diamond 116 thereover. The layer may then be cleaved along the horizontal line 118 so as to produce a layer of high purity diamond 116 on which is disposed a thin layer comprising the lines of quantum spin defects. The cleaving may be performed using a laser or using an implantation release mechanism. Implantation release may be particularly useful as it can yield very thin layers.

In Step (C), a series of channels or grooves 120 are cut into the thin layer such that each channel 120 runs parallel to, and spaced a short and uniform distance from, at least one line of quantum spin defects 110.

Finally, in Step (D), a further layer 122 is disposed over the channels 120 to seal the channels and form the microfluidic cell.

FIG. 11 illustrates a method for forming a microfluidic cell having a ring of quantum spin defects disposed around a microfluidic channel.

In Step A, a layer of diamond material 130 is provided. This may be high purity diamond material.

In Step (B), a ring shaped groove/channel 132 is cut into the surface of the layer of diamond 130.

In Step (C), a layer comprising quantum spin defects 134 is deposited over the layer 130.

In Step (D), the layer of quantum spin defects is planarized such that diamond material comprising the quantum spin defects only remains in the ring shaped groove thus forming a ring of quantum spin defect containing diamond material 136.

Finally, in Step (E), a channel 138 is formed which runs through the ring of quantum spin defect containing diamond material.

Example Synthesis

A synthetic type 1b HPHT diamond plate with a pair of approximately parallel major faces within approximately 5° of (001) was selected. The plate was fabricated into a square substrate suitable for homoepitaxial synthesis of single crystal CVD diamond material by a process including the following steps:

i) laser cutting of the substrate to produce a plate with all <100> edges;

ii) lapping and polishing the major surface upon which growth is to occur, the lapped and polished part having dimensions about 3.6 mm×3.6 mm by 535 µm thick, with all faces {100}.

The defect level at or below the substrate surface is minimised by careful preparation of the substrate as disclosed in EP 1 292 726 and EP 1 290 251. It is possible to reveal the defect levels being introduced by this processing by using a revealing plasma etch. It is possible routinely to produce substrates in which the density of defects measurable after a revealing etch is dependent primarily on the material quality and is below $5×10^3$ mm$^{-2}$, and generally below $10^2$ mm$^{-2}$. The substrate was mounted onto a substrate carrier. The substrate and its carrier were then introduced into a CVD reactor chamber and an etch and growth cycle commenced by feeding gases into the chamber as follows.

First, an in situ oxygen plasma etch was performed at a pressure of 165 Torr and a substrate temperature of 803° C., followed by a hydrogen etch, oxygen being removed from the gas flow at this stage. Then the first stage growth process was started by the addition of methane at 40 sccm (standard cubic centimeter per minute). Nitrogen was added to achieve a level of 700 ppb in the gas phase. Hydrogen was also present in the process gas. The substrate temperature at this stage was 866° C. The methane content was then increased to 175 sccm.

After the stage 1 growth layer reached a thickness of 1.7 mm, the stage 2 growth was commenced by removing the nitrogen which had been added to the gas phase. Growth was terminated after the stage 2 growth layer reached a thickness of 0.9 mm.

Study of the grown CVD diamond plate revealed that it was substantially free of twins and cracks on the (001) face, and bounded by <110> sides and post-synthesis dimensions of the twin free top (001) face were increased to 5.4 mm×5.4 mm.

The CVD diamond material produced by the aforementioned method can then be processed into a sensor by implanting a layer of NV defects, polishing the surface adjacent to the layer of NV defects, and forming a microfluidic channel adjacent to the polished surface.

Applications

Certain embodiments of the invention provide a small robust portable spin resonance device, preferably a hand-held device, for analysing fluid samples. One aspect of the present invention relates to a microfluidic cell comprising a diamond sensor suitable for sensing spin resonance signals from a fluid sample disposed in a channel of the microfluidic cell. A further aspect of the present invention relates to a spin resonance device adapted for use with said microfluidic cell. The spin resonance device may be a nuclear spin resonance (NMR) device and/or an electron spin resonance (ESR) device. The microfluidic cell may be provided as an integral component of the spin resonance device or the spin resonance device may be adapted such that the microfluidic cell can be removably mounted within the device.

Embodiments of the present invention have a wide range of possible applications. For example, certain embodiments may provide a hand-held medical diagnostics device, replacing what is only currently available in special analytical labs to provide a device which could be made available in the field, in doctor's surgeries, and in hospitals around the world opening up new opportunities for patient diagnosis and rapid treatment. The Basic technology is low cost and the calibration data needed to convert diamond data into useful analytical data already exists.

In practise a portable low cost NMR machine is likely to have many other advantages, not least for in-situ down well analysis where the harsh chemical and physical environment make diamond an excellent choice. This capability could be coupled with diamond based electrochemical sensors.

Benefits of utilizing diamond as a sensing material in a microfluidic cell include:
(a) Biocompatibility of diamond
(b) Other aspects of diamond functionality can be built in e.g. boron doped tips for electrochemical sterilization if used on humans
(c) Mechanical robustness of diamond
(d) General inertness of diamond
(e) Stability of defects in diamond
(f) Temperature insensitivity of defects in diamond.

According to certain embodiments of the present invention NV⁻ defects in diamond provide a method to measure magnetic and/or electric fields produced by electronic and nuclear spins with an unprecedented combination of sensitivity and spatial resolution. An MRI and/or NMR device may be integrated into a diamond chip with no need for large magnetic fields. Using a diamond based microfluidic cell, small volumes of liquid can be passed by an ensemble of NV⁻ defects and an MRI and/or NMR scan can be performed on a sample. Such a scanner can be used in a range of applications from biomedical applications to waste water management. For example, NMR analysis of blood is already used as a routine measurement where blood samples are sent away for analysis. For example, Liposcience™ uses NMR to measure the concentration of Low Density Lipoproteins. Lipoproteins interact with the arterial wall and set in motion the cascade of events that leads to atherosclerosis. A compact scanner comprising a diamond based microfluidic cell could perform MRI/NMR on blood in situ allowing a fast medical diagnoses and treatment response.

While this invention has been particularly shown and described with reference to preferred embodiments, it will be understood to those skilled in the art that various changes in form and detail may be made without departing from the scope of the invention as defined by the appendant claims.

The invention claimed is:

1. A microfluidic cell comprising:
a microfluidic channel for receiving a fluid sample; and
a sensor located adjacent the microfluidic channel;
wherein the sensor comprises a diamond material comprising one or more quantum spin defects;
wherein the diamond material forms at least a portion of the wall defining the microfluidic device,
wherein the one or more quantum spin defects are positioned at a distance equal to or less than 100 nm from said portion of the wall of the microfluidic channel, and
wherein the one or more quantum spin defects have a decoherence time $T_2$ equal to or greater than 0.05 ms.

2. A microfluidic cell according to claim 1, wherein at least one portion of the diamond material is formed of a single crystal diamond material having one or more of: a neutral single substitutional nitrogen concentration equal to or less than 20 ppb, 10 ppb, 5 ppb, 1 ppb or 0.5 ppb; an NV⁻ concentration equal to or less than 0.15 ppb, 0.1 ppb, 0.05 ppb, 0.001 ppb, 0.0001 ppb or 0.00005 ppb; and a total concentration of $^{13}C$ equal to or less than 0.9%, 0.7%, 0.4% 0.1%, 0.01%, or 0.001%.

3. A microfluidic cell according to claim 2, wherein at least one further portion of the diamond material is formed of a single crystal diamond material having one or more of: a single substitutional nitrogen concentration equal to or greater than 30 ppb, 50 ppb, 100 ppb, 200 ppb, 300 ppb, 500 ppb, 700 ppb, or 800 ppb; an NV⁻ concentration equal to or greater than 0.3 ppb, 0.5 ppb, 1 ppb, 2 ppb, 3 ppb, 5 ppb, 7 ppb, or 8 ppb; and a natural abundance of $^{13}C$.

4. A microfluidic cell according to claim 3, wherein the at least one further portion has a neutral single substitutional nitrogen concentration greater that the at least one portion by a factor of at least 5, 10, 20, 50, 100, 500, 1000, or 10000.

5. A microfluidic cell according to claim 3, wherein the at least one further portion has one or more of: a neutral single substitutional nitrogen concentration equal to or less than 5 ppm, 2 ppm, or 1 ppm; and an NV⁻ concentration equal to or equal to or less than 50 ppb, 20 ppb, or 10 ppb.

6. A microfluidic cell according to claim 1, wherein the one or more quantum spin defects comprise one or more NV⁻ defects.

7. A microfluidic cell according to claim 1, wherein an out-coupling structure is formed at a surface of the diamond material for increasing out-coupling of light.

8. A microfluidic cell according to claim 7, wherein the out-coupling structure is formed in a surface of the diamond material whereby the out-coupling structure is integrally formed by the diamond surface of the diamond material.

9. A spin resonance device comprising:
a microfluidic cell according to claim 1 and a spin resonance device comprising a cell receiving bay for receiving the microfluidic cell, the spin resonance device further comprising:
a first variable oscillating field generator for manipulating quantum spins within a sample disposed within the microfluidic channel of the microfluidic cell when mounted in the cell receiving bay;
a second variable oscillating field generator for manipulating the one or more quantum spin defects in the sensor of the microfluidic cell when mounted in the cell receiving bay;
a light source for optically pumping the one or more quantum spin defects in the sensor of the microfluidic cell when mounted in the cell receiving bay; and
a detector for detecting emission from one or more decaying quantum spin defects in the sensor of the microfluidic cell when mounted in the cell receiving bay.

10. A spin resonance device according to claim 9, wherein the first variable oscillating field generator and the second oscillating variable field generator are magnetic or electric field generators.

11. A spin resonance device according to claim 9, further comprising a static field generator.

12. A spin resonance device according to claim 9, wherein the cell receiving bay is configured to removable mount the microfluidic cell.

13. A spin resonance device according to claim 9, further configured to separately address quantum spin defects along the microfluidic channel to monitor chemical processes as they proceed down the microfluidic channel.

14. A microfluidic cell according to claim 1, wherein the one or more quantum spin defects are positioned at a distance from the microfluidic channel equal to or less than: 80 nm; 50 nm; 30 nm; 20 nm; or 10 nm.

15. A microfluidic cell according to claim 1, wherein said portion of the wall is terminated with a spin-zero species.

16. A microfluidic cell according to claim 1, wherein said portion of the wall is terminated with oxygen.

17. A microfluidic cell according to claim 1, wherein the one or more quantum spin defects have a decoherence time $T_2$ equal to or greater than 0.1 ms, 0.1 ms, 0.3 ms, 0.6 ms, 1 ms, 5 ms, or 15 ms.

* * * * *